(12) United States Patent
Schaffer

(10) Patent No.: US 6,771,997 B2
(45) Date of Patent: Aug. 3, 2004

(54) RESPIRATORY COMPENSATION IN MRI CORONARY IMAGING USING DIMINISHING VARIANCE

(75) Inventor: Robert W. Schaffer, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 525 days.

(21) Appl. No.: 09/952,846

(22) Filed: Sep. 11, 2001

(65) Prior Publication Data

US 2003/0050554 A1 Mar. 13, 2003

(51) Int. Cl.[7] .............................................. A61B 5/055
(52) U.S. Cl. ........................ 600/410; 324/307; 324/309
(58) Field of Search ................................ 600/410, 411; 324/307, 309

(56) References Cited

U.S. PATENT DOCUMENTS

| | | | |
|---|---|---|---|
| 5,427,101 A | | 6/1995 | Sachs et al. |
| 6,094,591 A | * | 7/2000 | Foltz et al. .................. 600/419 |
| 2003/0216638 A1 | * | 11/2003 | Dharmakumar et al. .... 600/420 |

OTHER PUBLICATIONS

Ehman, Richard L. et al., "Adaptive Technique for High-Definition MR Imaging of Moving Structures," Radiology, 173, pp. 255–263, 1989.

Sachs, Todd S. et al., "The Diminishing Variance Algorithm for Real–Time Reduction of Motion Artifacts in MRI," MRM 34, pp. 412–422, 1995.

Sachs, Todd S. et al., "The Real–Time Interactive 3–D–DVA for Robust Coronary MRA," IEEE Transactions on Medical Imaging, vol. 19, No. 2, pp. 73–79, Feb. 2000.

Jhooti, P. et al., "Phase Ordeirng With Automatic Window Selection (PAWS): A Novel Motion–Resistant Technique for 3D Coronary Imaging," Magnetic Resonance in Medicine 43, pp. 470–480, 2000.

Schaffer, R.W. et al., "An Improved Diminishing Variance Algorithm for Respiratory Compensation in Coronary Imaging," ISMRM, poster abstract, 2 pp, Apr. 21, 2001.

* cited by examiner

Primary Examiner—Eleni Mantis Mercader
(74) Attorney, Agent, or Firm—Beyer Weaver & Thomas LLP

(57) ABSTRACT

The effects of complex motion of the heart and surrounding anatomy due to cardiac and respiratory motion is reduced in high resolution imaging of coronary arteries using a diminishing variance algorithm (DVA) using a navigator for tracking heart motion and iteratively reacquiring data frames where a data frame has a positional variance from a cumulative histogram of data. A target position is continually calculated from the cumulative histogram which is smoothed such as by low-pass filtering to continually provide a target position. An image histogram is developed based on a limited number of image frames which are iteratively replaced to attain desired image quality.

14 Claims, 7 Drawing Sheets

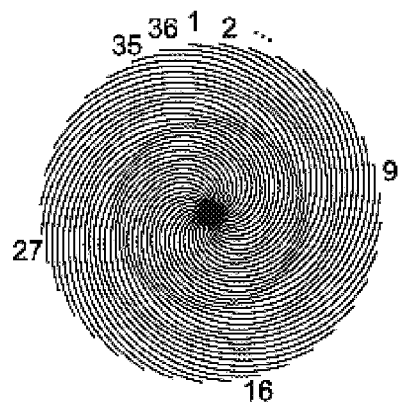
| Interleaf # | Position | Interleaf # | Position |
|---|---|---|---|
| 1 | -2 | 19 | 0 |
| 2 | 3 | 20 | -1 |
| 3 | 4 | 21 | 3 |
| 4 | -1 | 22 | -2 |
| 5 | -2 | 23 | -1 |
| 6 | 3 | 24 | 4 |
| 7 | -3 | 25 | 0 |
| 8 | -1 | 26 | 3 |
| 9 | 0 | 27 | -2 |
| 10 | 3 | 28 | 3 |
| 11 | 1 | 29 | -1 |
| 12 | 3 | 30 | -3 |
| 13 | -1 | 31 | 0 |
| 14 | -2 | 32 | 3 |
| 15 | 0 | 33 | -2 |
| 16 | -1 | 34 | 3 |
| 17 | -2 | 35 | -1 |
| 18 | 3 | 36 | 3 |
*FIG. 2A*
*FIG. 2B*
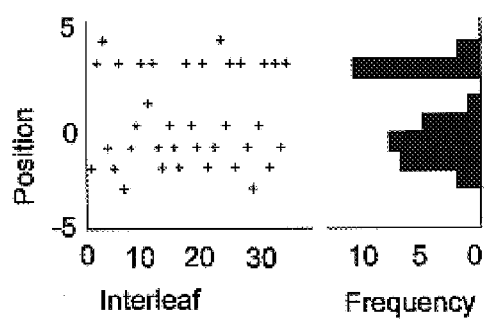
*FIG. 3A*
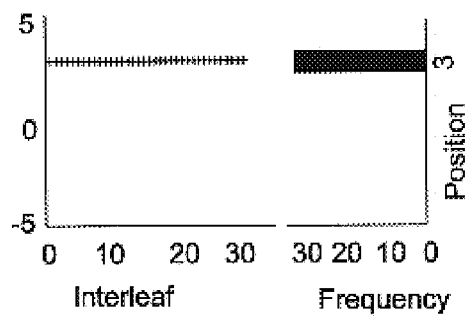
*FIG. 3B*

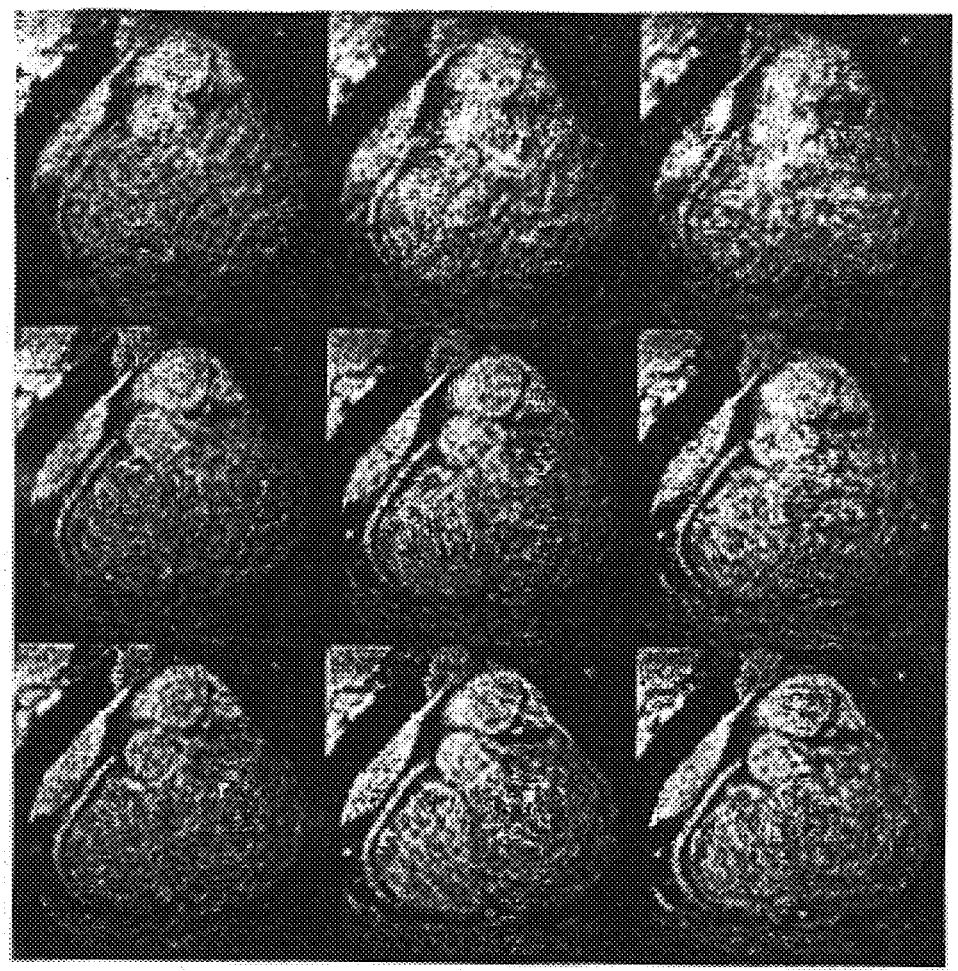
*FIG. 10A*   *FIG. 10B*   *FIG. 10C*

RESPIRATORY COMPENSATION IN MRI CORONARY IMAGING USING DIMINISHING VARIANCE

STATEMENT AS TO RIGHTS TO INVENTIONS MADE UNDER FEDERALLY SPONSORED RESEARCH OR DEVELOPMENT

The U.S. government has rights in this invention pursuant to NIH Grant HL39297 and HL07846 with Stanford University, Assignee.

BACKGROUND OF THE INVENTION

This invention relates generally to Magnetic Resonance Imaging (MRI), and more particularly the invention relates to real time reduction of motion artifacts in MRI.

One of the most challenging areas in Magnetic Resonance Imaging (MRI) research is high-resolution imaging of the coronary arteries. The complexity of the motion of the heart and its surrounding structures due to cardiac and respiratory motion makes obtaining useful coronary artery images very difficult. If this motion can be temporarily paused, better images can be obtained. In essence, this is achieved through cardiac-gated, breath-held scans. Cardiac gating allows the acquisition of data frames at the same point in the cardiac cycle, thus freezing the cardiac motion with respect to the other data frames, while breath holding is an easy way to remove respiratory motion artifacts. Fast scanning techniques can produce useful images in the span of one breath-hold. In three-dimensional (3D) imaging and submillimeter resolution imaging, multiple breath-holds are usually required. In reality, the practice will be to use breath-holds when possible because they are easy and effective, however, movement that can occur at the latter part of a breath-hold and, in a smaller percentage of patients, an inability to maintain a long breath-hold or reproduce duplicate breath-holds can cause problems and require other methods to acquire useful coronary artery images.

Disclosed in U.S. Pat. No. 5,427,101 for "Diminishing Variance Process for Real Time Reduction of Motion Artifacts in MRI" of Sachs, Meyer, and Nishimura, is a method whereby motion can be detected in real time during the acquisition of MRI data. This enables the implementation of several algorithms to reduce or eliminate this motion from an image as it is being acquired. The method is an extension of the acceptance/rejection method algorithm called the diminishing variance algorithm (DVA). With this method, a complete set of preliminary data is acquired along with information about the relative motion position of each frame of data. After all the preliminary data is acquired, the position information is used to determine which lines are most corrupted by motion. Frames of data are then reacquired, starting with the most corrupted frame. The position information is continually updated in an iterative process, therefore each subsequent reacquisition is always done on the worst frame of data.

FIG. 1 is a flow diagram of the diminishing variance process disclosed in U.S. Pat. No. 5,427,101. Initially, a complete set of data frames, as required to construct an image, is acquired with each frame having a mechanism for indicating a relative position of the frame. A histogram of positional shifts in the frames is then developed, and the positionally worst data frames due to motion are then reacquired. The histogram is updated, and the positionally worst data frames in the updated histogram are reacquired. This process is continued until an image which is motion free is realized. As used herein, a data frame is a portion of the data, typically a single line in k-space for 2DFT imaging or a simple spiral interleaf for interleaved spiral imagery.

The present invention is an improvement to the diminishing variance process disclosed in U.S. Pat. No. 5,427,101.

BRIEF SUMMARY OF THE INVENTION

In accordance with the invention, a diminishing variance algorithm (DVA) is used to operate on MRI data frames. A cumulative histogram is obtained from all data frames, and an image histogram is obtained using a limited number (e.g. 36) frames with the outlier or worst frames in the image histogram being continually replaced.

A target position is calculated for the imaged object based on the cumulative histogram. In accordance with a feature of the invention, in calculating the mode or target position the cumulative histogram is low-pass filtered to smooth the cumulative data. This can be done by averaging adjacent bin values. In accordance with another feature of the invention, the target position is recalculated based on the cumulative histogram throughout the scan, thereby allowing faster response to a patient's movement and faster convergence based on the new target position.

The invention and objects and features thereof will be more readily apparent from the following detailed description and dependent claims when taken with the drawings.

BRIEF DESCRIPTION OF THE DRAWINGS

FIGS. 2A and 2B are an interleaved spiral k-spaced trajectory with 36 data frames and a sample of corresponding heart positions given in number of resolution pixels from an initial position, respectively.

FIGS. 3A and 3B are scatter plots and histograms of original sample data and converged data, respectively.

FIGS. 10A–10C are cardiac gated interleaved spiral images of a) conventional 3D-DVA, b) 3D-DVA with histogram smoothing, and c) 3D-DVA with a continuously updated average.

DETAILED DESCRIPTION OF THE INVENTION

An embodiment of the invention will be described with respect to a spiral k-spaced trajectory as illustrated in FIG. 2A with 36 data frames or interleaves. A sample of corresponding heart positions in number of resolution pixels from an initial position is tabulated in FIG. 2B.

Each spiral interleaf has a corresponding heart position. The DVA iteratively reacquires and replaces image histogram outliers with the goal of creating an image with data frames acquired with the heart in the same position. FIG. 3A shows the sample position data at the completion of the initial cycle, and FIG. 3B shows the goal position data for the DVA. Ideally, all of the position data will converge to a single bin in the histogram, as in FIG. 3B.

In this example, if the position or mode is used to calculate the average, the target position is 3 and the first interleaves to be reacquired correspond to position −3 (interleaves 7 and 30). The overscan continues as described until complete convergence is made, or until the image is acceptable. A sample progression can be seen in FIGS. 4A–4D which are scatter plots and image histograms of the position data from FIG. 2 as the DVA progresses with a target position of 3 after: a) initial 36 acquisitions, b) 9 outlier replacements, c) 17 replacements, d) 23 replacements. Since some reacquisitions can happen with the heart in a further position than it started in, the exact number of overscan iterations can be greater than the number of outlier replacements.

The original DVA, as described up to this point, uses one navigator to trace the position of the heart (or diaphragm) in one direction. A navigator is described in U.S. Pat. No. 5,427,101 and in Ehman et al., *Adaptive Technique for High-definition MR Imaging of Moving Structures*, RADIOLOGY 173:255–263 (1989), and Korin et al., *Compensation for Effects of Linear Motion in MR Imaging*, MAGNETIC RESONANCE IN MEDICINE 12:99–113 (1989). A three-dimensional DVA (3D-DVA) uses three navigators to track the heart in the superior/inferior (S/I), anterior/posterior (A/P) and right/left (R/L) directions. These navigators are placed sequentially, immediately after the data acquisition. The 3D-DVA stores the position data for three directions and thus, maintains three image histograms and three cumulative histograms. Three distinct targets are calculated. A total distance from the target positions is determined for each data frame by adding the distance from the target in each direction. The data frame with the largest corresponding total distance is considered the 'worst' frames and is the next to be reacquired.

Figure 1:
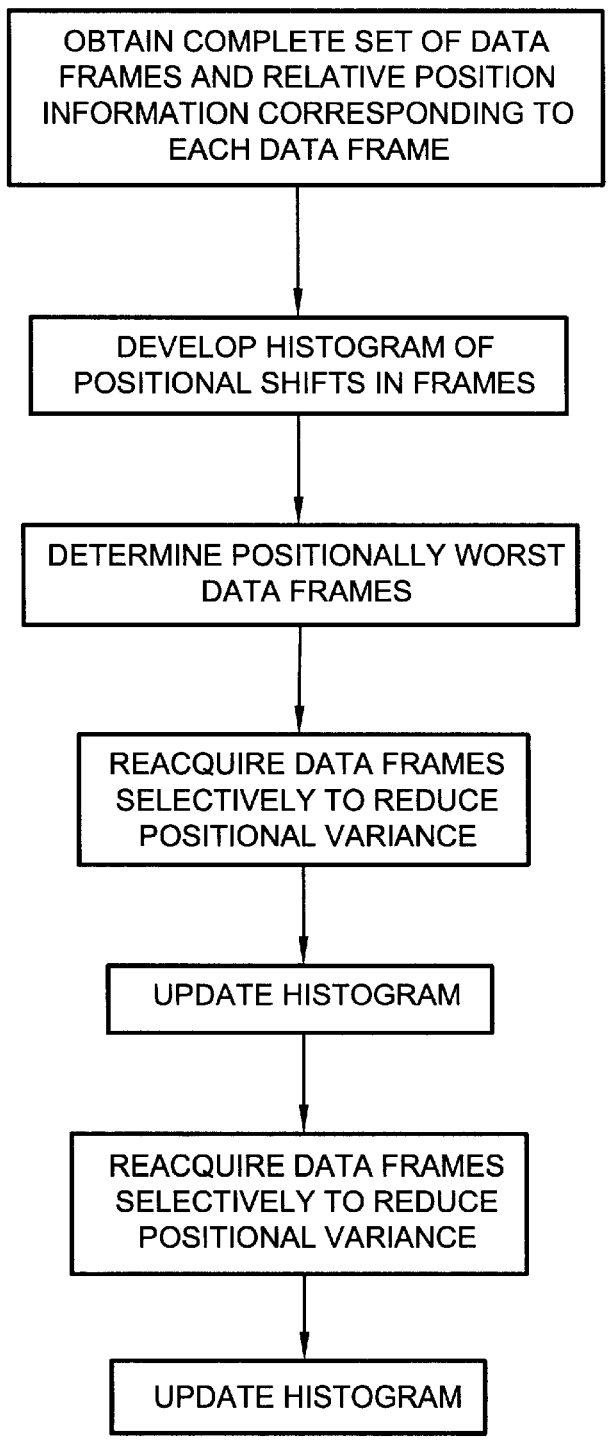
FIG. 1 is a flow diagram illustrating a prior art application of DVA.
Figure 4A:
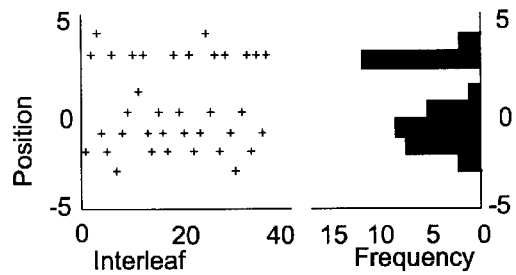
FIGS. 4A–4D are scatter plots and image histograms of position data from FIG. 2 as the DVA progresses from a target position of 3 after a) initial 36 acquisitions, b) 9 outlier replacements, c) 17 replacements, and d) 23 replacements.
Figure 4B:
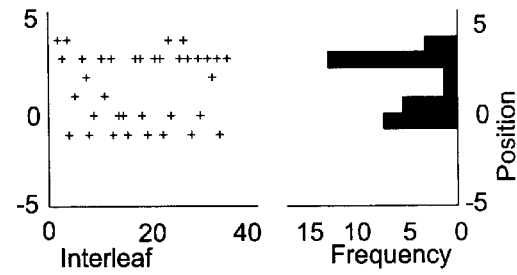
Figure 4C:
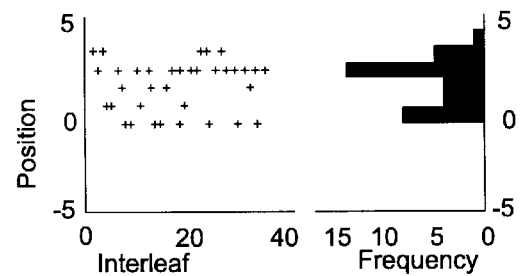
Figure 4D:
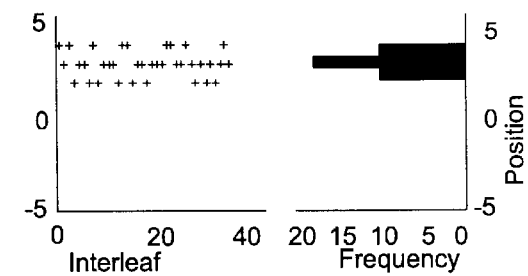
Figure 5A:
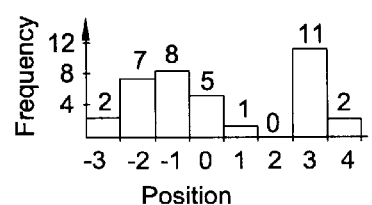
FIGS. 5A and 5B illustrate an original cumulative histogram and image histogram matched with 36 frames, and a smooth histogram with filtering.
Figure 5B:
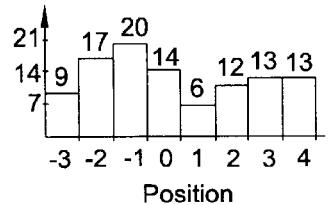
Figure 6A:
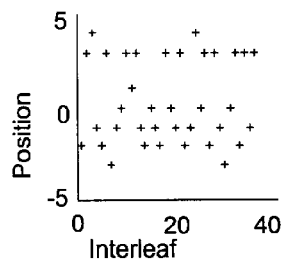
FIGS. 6A–6D illustrate scatter plots and image histograms of position data as a DVA progresses with a target of −1 after a) initial 36 acquisitions, b) 9 outlier replacements, c) 14 replacements, and d) 19 replacements.
Figure 6B:
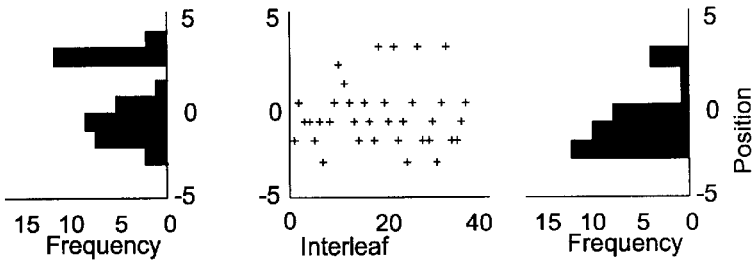
Figure 6C:
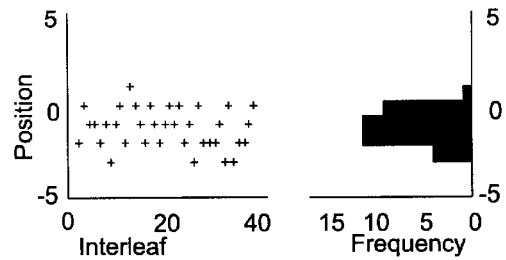
Figure 6D:
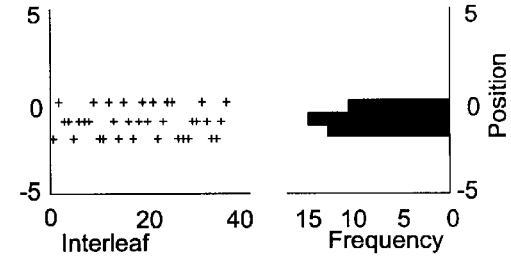

Careful observation of the position data in FIG. 3A shows that the mode (position 3) does not reflect the most common general region for the heart. By applying a low-pass filter to the histogram, we smooth outliers and the new mode more accurately reflects the most common position of the heart. FIGS. 5A and 5B show a detailed example of the position data from FIG. 2 before and after a low-pass filter is applied. In this example, the filter has a width of three and basically replaces each bin with its original value added to its adjacent bins. While the original DVA would calculate a target of position 3, by filtering we avoid the outlier and the calculated target is position −1. The scatter plot in FIG. 3A illustrates there are more data points around position −1, so it is a better choice for a target because it will allow for faster convergence and a better initial image.

FIGS. 6A–6D show how the DVA will progress more quickly using this new target. These figures show scatter plots and image histograms of the position data as the DVA progresses with a target of −1, instead of −3 after: a) initial 36 acquisitions, b) 9 outlier replacements, c) 14 replacements, d) 19 replacements. Here, the image histogram mode changes from 3 to −3 to −1. The DVA reacquires and replaces positions furthest from the target. Since the heart position during the new acquisitions is unknown, the mode of the image histogram may change while the DVA is attempting to converge on a target.

Figure 7:
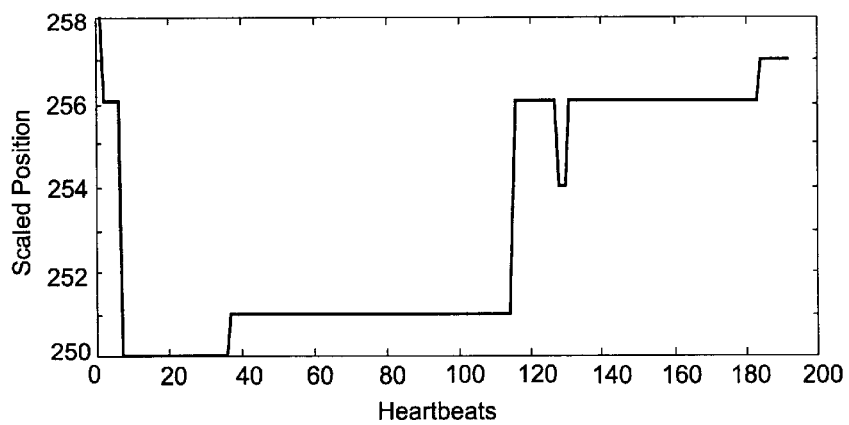
FIG. 7 is a plot of a S/I direction mode during a DVA scan.

A number of factors can cause longer scan times in the original DVA. One of the most common problems is a change in the patient's movement. A shift on the scanner bed or respiratory drift can cause the heart to be in a different set of positions than it was in during the initial DVA cycle. In terms of the algorithm, this means that the current heart position could be far away from the target position that was calculated at the end of the initial cycle. This results in the same data frame being reacquired many times without getting closer to the target, thus wasting many iterations scanning the same data frame without improving the image. FIG. 7 shows an example of how a mode or position can change during the scan. Here, the mode is calculated from one of 512 positions. Position 256 corresponds to the initial.

In another modification, instead of calculating the target heart position only once (immediately after the initial cycle is completed), we continuously update the mode during the overscan based on the cumulative histogram of all heart positions collected. The new 3D-DVA has three continuously updating modes. If a target changes (one or more of the three directions), we update to a full data set with corresponding heart positions closest to the new targets and continue with the overscan based on the new target positions, thus minimizing the time to convergence and yielding the best possible image as early as possible.

Figure 8:
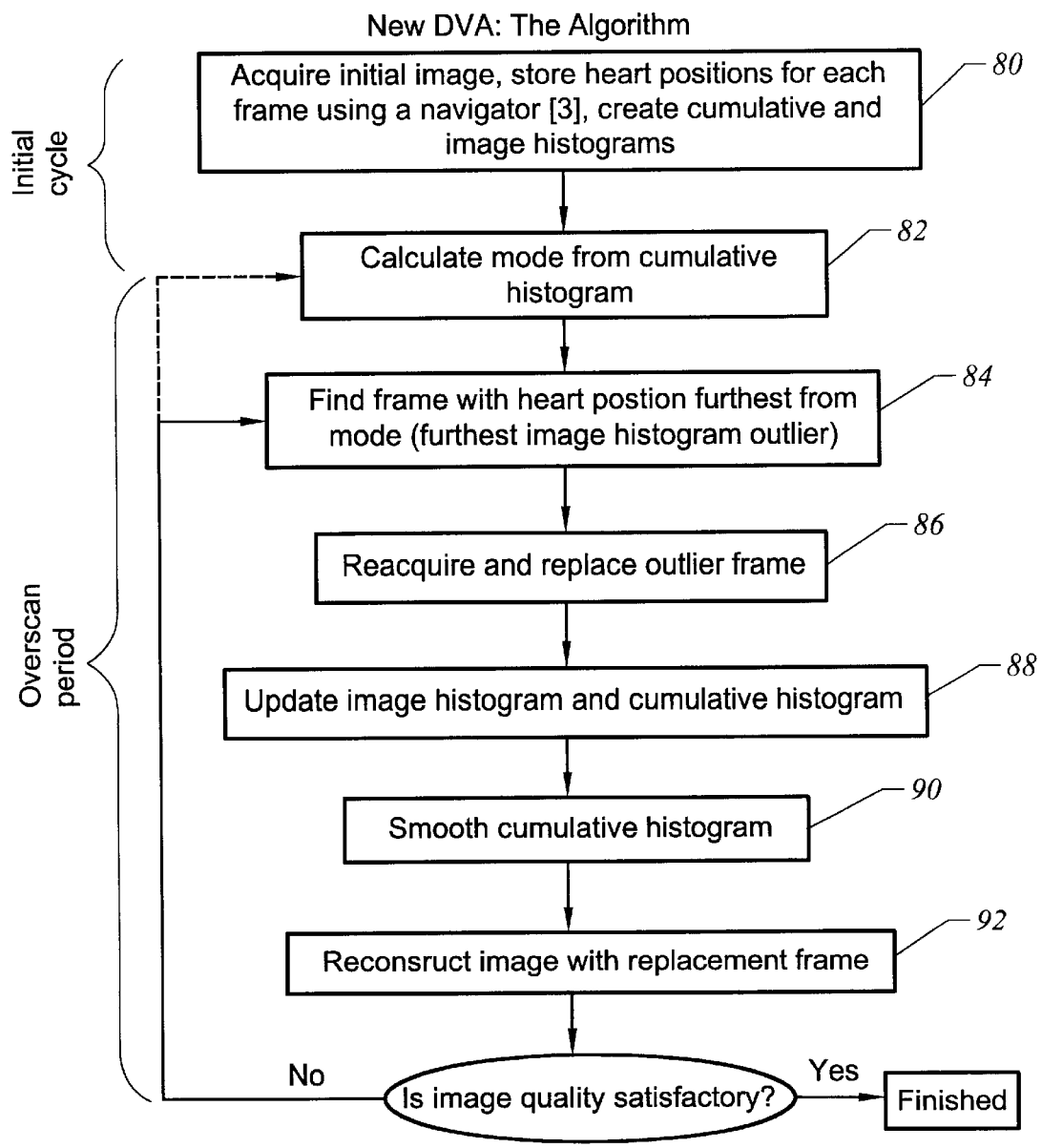
FIG. 8 is a flow diagram of the DVA in accordance with the present invention.

FIG. 8 is a flowchart of the DVA as modified in accordance with the invention. Initially, data frames for an image are acquired at 80, and heart positions for each frame are stored using a navigator for each frame. Cumulative and image histograms are created using the acquired data. The mode or position of the heart is calculated from the cumulative histogram at 82, and then the frame with heart position farthest from the mode is identified at 84. This frame is reacquired at 86, and the image histogram is updated at 88. The cumulative histogram is smoothed at 90, by way of low pass filtering for example, and the image is reconstructed with the replacement frame at 92. If the image quality is not satisfactory, then the sequence is repeated beginning with mode calculation at 82. Otherwise, the algorithm execution is finished.

Navigator echoes use a 2 cm diameter cylindrical excitation with a 1D readout along the excitation axis. During each cardiac cycle, a data frame is acquired. For 3D-DVA, three navigators are acquired after the data frame to avoid saturation. Navigators yield projections in the S/I, A/P and R/L directions that are cross-correlated with reference projections. A number of methods can be used to determine the relative position including: (1) the maximum value of the cross-correlation, (2) edge detection (more applicable, for navigators that are pointed at the diaphragm), and (3) object detection and translation determination. The maximum value of the cross-correlation can be used with cardiac gating since there is time to perform the computations.

The low-pass filters can have any width. Applying the low-pass filter, in the easiest case, just adds or averages adjacent bins together. More advanced filtering methods can be applied to include more bins or give more weight to the central bin(s). In all filtering cases, the goal is to modify the cumulative histogram so the calculated target position more accurately represents the most common position of the heart. A filter width of three can give the best improvement on the calculation of the target position.

The DVA can use any trajectory. Each has the goal of compiling a complete set of data frames acquired with the heart in the same relative position. A spiral k-space trajectory provides nice flow properties, but any trajectory can be used.

To implement the DVA, communication is required between a real-time display application and the scanner. The real-time application controls the navigator's position and size, displays the images and calculates the next frame to request from the scanner. The requested frame is sent to the scanner. After the scanner completes the next scan interval, the real-time application retrieves the new data frame and the new navigator information so the position data can be calculated.

This invention has been implemented on a GE Signa 1.5 T CV/i scanner (General Electric Inc., Milwaukee, Wis.). The pulse sequences were designed for gradients capable of 40 mT/m magnitude and 150 mT/m/msec slew rate, with a receiver capable of 4 µsec sampling (±125 kHz). A body coil was used for RF transmission and a 5-inch surface coil was used for signal reception. An external workstation was used to provide interactive control over the navigators.

Figure 9:
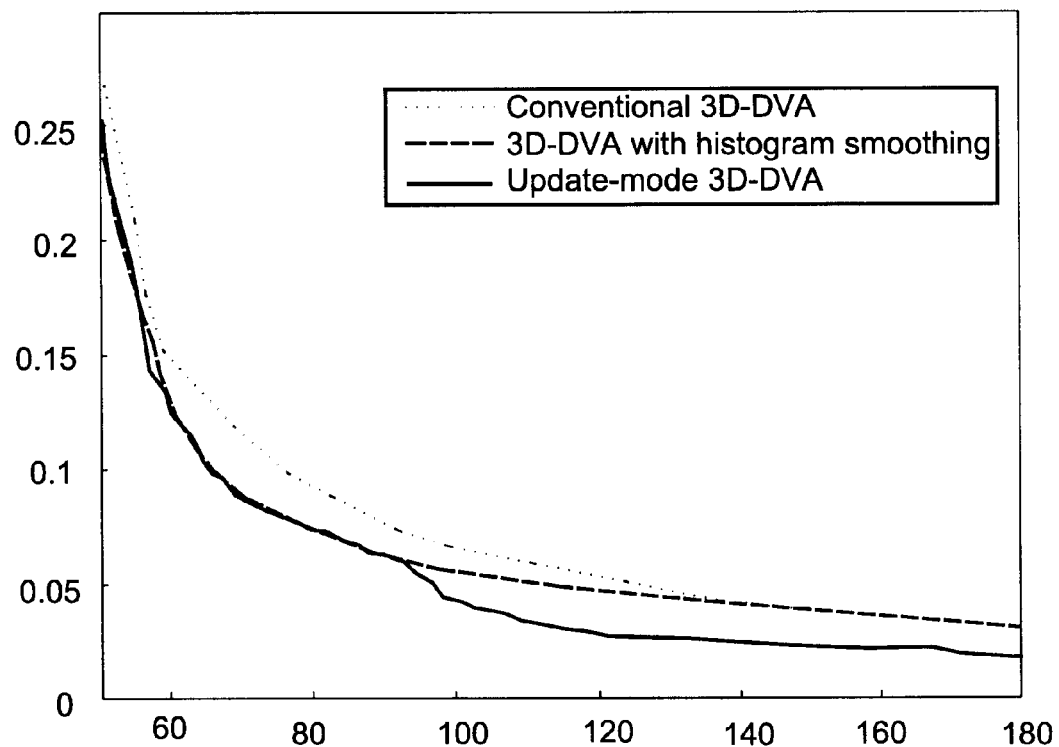
FIG. 9 is a plot of standard deviation of heart position data in an image histogram averaged from 13 scans of six volunteers.

Scans were performed on volunteers and the total distance was presumed from the targets (for each direction) for each of the 36 interleaves used in the image. This total distance is the variance in positions. As the DVA progressed, the variance in position decreased. We compared the convergence of the total distance for the original 3D-DVA, the 3D-DVA with histogram filtering and the 3D-DVA with mode updating. FIG. 9 shows that the 3D-DVA with histogram smoothing and the update-mode 3D-DVA initially converge more quickly than the conventional 3D-DVA. After 100 heartbeats, the update-mode 3D-DVA continues to improve more quickly than the other two methods. The images in FIGS 10A–10C (left anterior oblique (LAO) of the right coronary artery (RCA) support this. The figures show cardiac-gated interleaved spiral images (cropped to isolate the right coronary artery) with 36 interleaves, FOV of 24 cm, and 256×256 resolution after 60 heartbeats using a) conventional 3D-DVA with histogram smoothing, c) 3D-DVA with a continuously updated average. All three methods show clear images after 140 images. In this case, the volunteer did not move enough to change the mode significantly, so the original DVA converged to a useful image.

We also performed scans using filtering and histogram update simultaneously. This proved to be as effective as the update-mode 3D-DVA without histogram filtering. The histogram-filtering method results in a faster convergence to a useful image, however it does not result in a better image overall. The reason is that the smoothing of the histogram picks a better mode to begin with, however, over time it should converge to an image very similar to the original DVA.

The diminishing variance algorithm as implemented with the modifications in accordance with the invention reduce over-scan time and improves robustness of image quality. Smoothing the histogram prior to mode calculation and continuously updating the mode yield better and faster high resolution coronary images. The method in accordance with the invention provides a more robust and effective method for respiratory compensation in coronary imaging.

While the invention has been described with reference to specific embodiments, the description is illustrative of the invention and is not to be constructed as limiting the invention. Various modification and applications may occur to those skilled in the art without departing from the true spirit and scope of the invention as defined by the appended claims.

What is claimed is:

1. A method for respiratory compensation in MRI coronary imaging comprising the steps of:
    a) acquiring MRI signals from multiple image frames,
    b) acquiring relative position data for each image frame,
    c) developing a cumulative histogram of position data,
    d) smoothing the cumulative histogram data,
    e) calculating a target position based on the smoothed cumulative histogram data,
    f) developing an image histogram based on a limited number of image frames, and
    g) iteratively replacing data frames in the image histogram.

2. The method as defined by claim 1 wherein step b) includes the use of a navigator to determine position.

3. The method as defined by claim 2 wherein step b) includes the use of a plurality of navigators with each frame for multi-dimensional imaging.

4. The method as defined by claim 1 wherein step d) includes low-pass filtering the cumulative histogram data.

5. The method as defined by claim 4 wherein the low-pass filtering includes summing adjacent position data.

6. The method as defined by claim 1 wherein step e) includes continually recalculating target positions from the smoothed cumulative histogram.

7. The method as defined by claim 6 and further including the step of:
    a) repeating steps a) through g) until image quality is satisfactory.

8. The method as defined by claim 7 wherein step b) includes the use of a navigator to determine position.

9. The method as defined by claim 8 wherein step b) includes the use of a plurality of navigators with each frame for 3D imaging.

10. The method as defined by claim 7 wherein step d) includes low-pass filtering the cumulative histogram data.

11. The method as defined by claim 10 wherein the low-pass filtering includes summing adjacent position data.

12. The method as defined by claim 11 wherein step a) includes acquiring data for a spiral k-spaced trajectory with multiple interleaves.

13. The method as defined by claim 7 wherein step a) includes acquiring data for a spiral k-spaced trajectory with multiple interleaves.

14. The method as defined by claim 1 wherein step a) includes acquiring data for a spiral k-spaced trajectory with multiple interleaves.

* * * * *